(12) United States Patent
Lee

(10) Patent No.: US 7,442,070 B2
(45) Date of Patent: Oct. 28, 2008

(54) LIGHT-EMITTING CELL MODULE

(75) Inventor: Ipson Lee, Taoyuan (TW)

(73) Assignee: Super Link Electronics Co., Ltd., Taoyuan Hsien (TW)

( * ) Notice: Subject to any disclaimer, the term of this patent is extended or adjusted under 35 U.S.C. 154(b) by 0 days.

(21) Appl. No.: 11/706,325

(22) Filed: Feb. 15, 2007

(65) Prior Publication Data

US 2008/0200061 A1 Aug. 21, 2008

(51) Int. Cl.
*H01R 4/24* (2006.01)
(52) U.S. Cl. ........................ 439/417; 362/249
(58) Field of Classification Search ............... 439/417, 439/419, 425; 362/800, 219, 249
See application file for complete search history.

(56) References Cited

U.S. PATENT DOCUMENTS

| | | | |
|---|---|---|---|
| 4,984,999 A * | 1/1991 | Leake | 439/425 |
| 5,045,981 A * | 9/1991 | Nagano | 362/219 |
| 6,017,241 A * | 1/2000 | Komai | 439/419 |
| 6,093,048 A * | 7/2000 | Arnett et al. | 439/404 |
| 6,660,935 B2 * | 12/2003 | Southard et al. | 362/640 |
| 7,114,841 B2 * | 10/2006 | Aanegola et al. | 362/640 |
| 7,160,140 B1 * | 1/2007 | Mrakovich et al. | 439/417 |
| 2006/0197474 A1 * | 9/2006 | Olsen | 315/312 |
| 2008/0030981 A1 * | 2/2008 | Mrakovich et al. | 362/219 |

* cited by examiner

*Primary Examiner*—Neil Abrams
(74) *Attorney, Agent, or Firm*—Rosenberg, Klein & Lee

(57) ABSTRACT

A light-emitting cell module includes a base seat and multiple terminals respectively inlaid in the base seat. A first end of each terminal being exposed to outer side of a first end of the base seat. A second end of each terminal having a sharp thrust section protruding from a second end of the base seat. A connecting seat latched with the second end of the base seat, the connecting seat and the second end of the base seat together tightly clamping and holding multiple leads of positive electrode and negative electrode, the second ends of the terminals being aligned with the corresponding leads, whereby the thrust sections of the second ends thrust into the leads to electrically connect the terminals with the leads. A light-emitting cell having two pins which are soldered with the first ends of the terminals of the positive electrode and the negative electrode.

2 Claims, 6 Drawing Sheets

LIGHT-EMITTING CELL MODULE

BACKGROUND OF THE INVENTION

1. Field of the Invention

The present invention is related to a light-emitting cell module in which a light-emitting cell such as a light-emitting diode is soldered between two terminals of a base seat. The base seat is latched with a connecting seat to tightly clamp the leads of different polarities in a desired position. The terminals inlaid in the base seat respectively thrust into the leads to electrically connect therewith. After powered on, the light-emitting cell is lighted up.

2. Description of the Prior Art

FIG. 7 shows the light-emitting diodes (LED) 63 of the conventional Christmas light, decoration light, etc. Two pins 631, 632 of the LED 63 soldered on two leads 61, 62. When powered on, the LED is lighted up. In manufacturing, the pins of the LED must be laboriously soldered with the leads 61, 62 one by one. It is time-consuming to manufacture the above decoration lights. In addition, the manufacturing cost is relatively high. Moreover, the LED is fixedly soldered on the leads 61, 62 so that the position of the LED cannot be changed as necessary. Also, such decoration light generally has a considerable length. The LED 63 protruding from the leads tends to be tangled with the leads and torn away.

FIG. 8 shows another type of decoration light in which tiny light-emitting diodes 64 are soldered on a circuit board 65 by way of surface mount technology (SMT). The leads 61, 62 are soldered between the adjacent circuit boards 65, whereby the circuit boards 65 are serially connected to form a stream of decoration lights. In manufacturing, the leads 61, 62 are interconnected between the circuit boards 65 so that the manufacturing procedure is complicated. In addition, it takes more time to manufacture the decoration lights and the manufacturing cost is increased. Moreover, in the case that a user forcedly pulls the leads 61, 62, the leads 61, 62 tend to detach from the circuit boards 65. Furthermore, as in the aforesaid decoration light, after manufactured, the intervals between the circuit boards 65 are fixed. It is impossible for a user to change the distance between two adjacent circuit boards 65 as necessary.

SUMMARY OF THE INVENTION

It is therefore a primary object of the present invention to provide a light-emitting cell module including: a base seat; multiple terminals respectively inlaid in the base seat, a first end of each terminal being exposed to outer side of a first end of the base seat, a second end of each terminal having a sharp thrust section protruding from a second end of the base seat; a connecting seat latched with the second end of the base seat, the connecting seat and the second end of the base seat together tightly clamping and holding multiple leads of positive electrode and negative electrode, the second ends of the terminals being aligned with the corresponding leads, whereby the thrust sections of the second ends thrust into the leads to electrically connect the terminals with the leads; and a light-emitting cell having two pins which are soldered with the first ends of the terminals of the positive electrode and the negative electrode. After powered on, the light-emitting cell is lighted up.

The present invention can be best understood through the following description and accompanying drawings wherein:

DETAILED DESCRIPTION OF THE PREFERRED EMBODIMENTS

Figure 1:
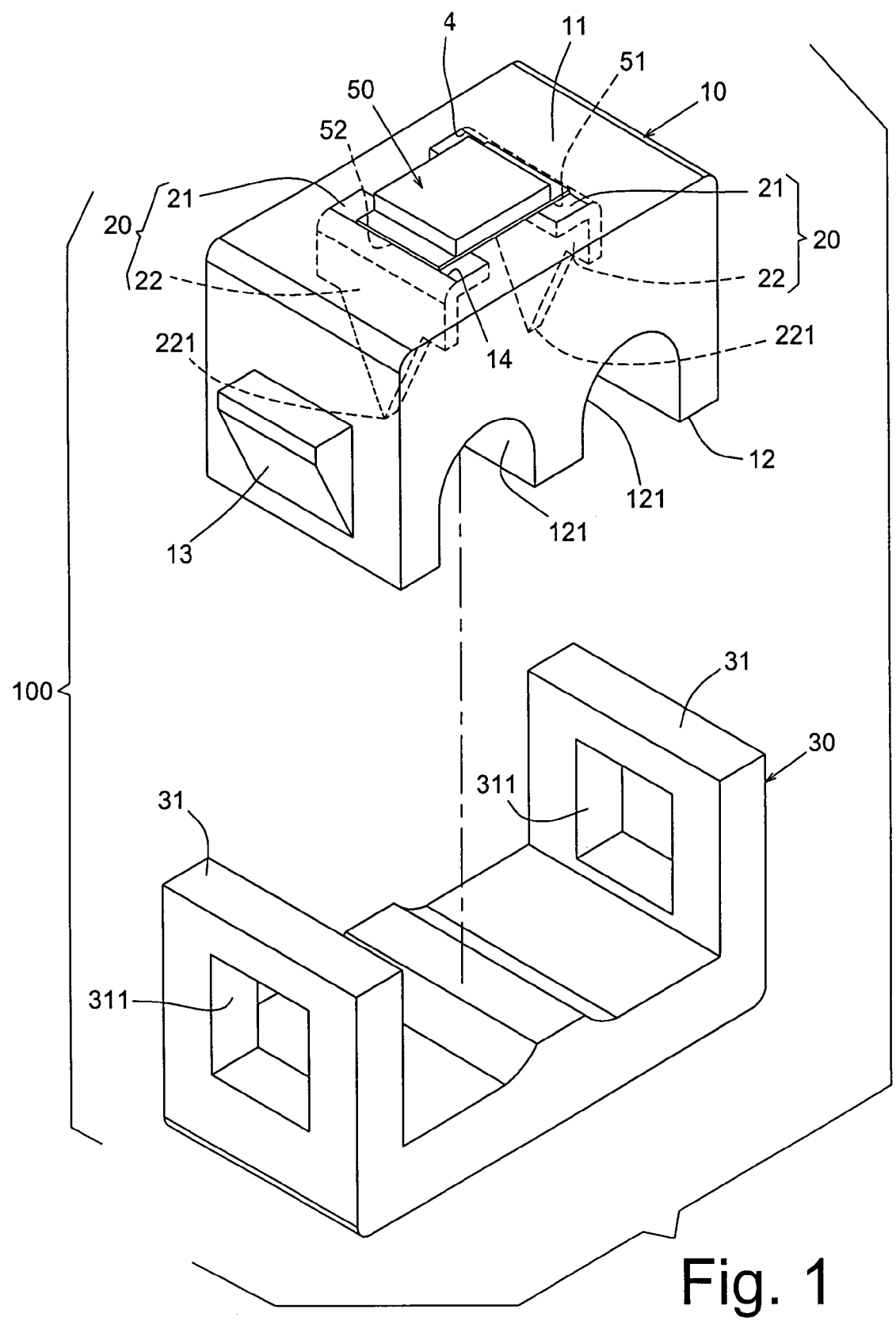
FIG. 1 is a perspective exploded view of a first embodiment of the present invention.
Figure 2:
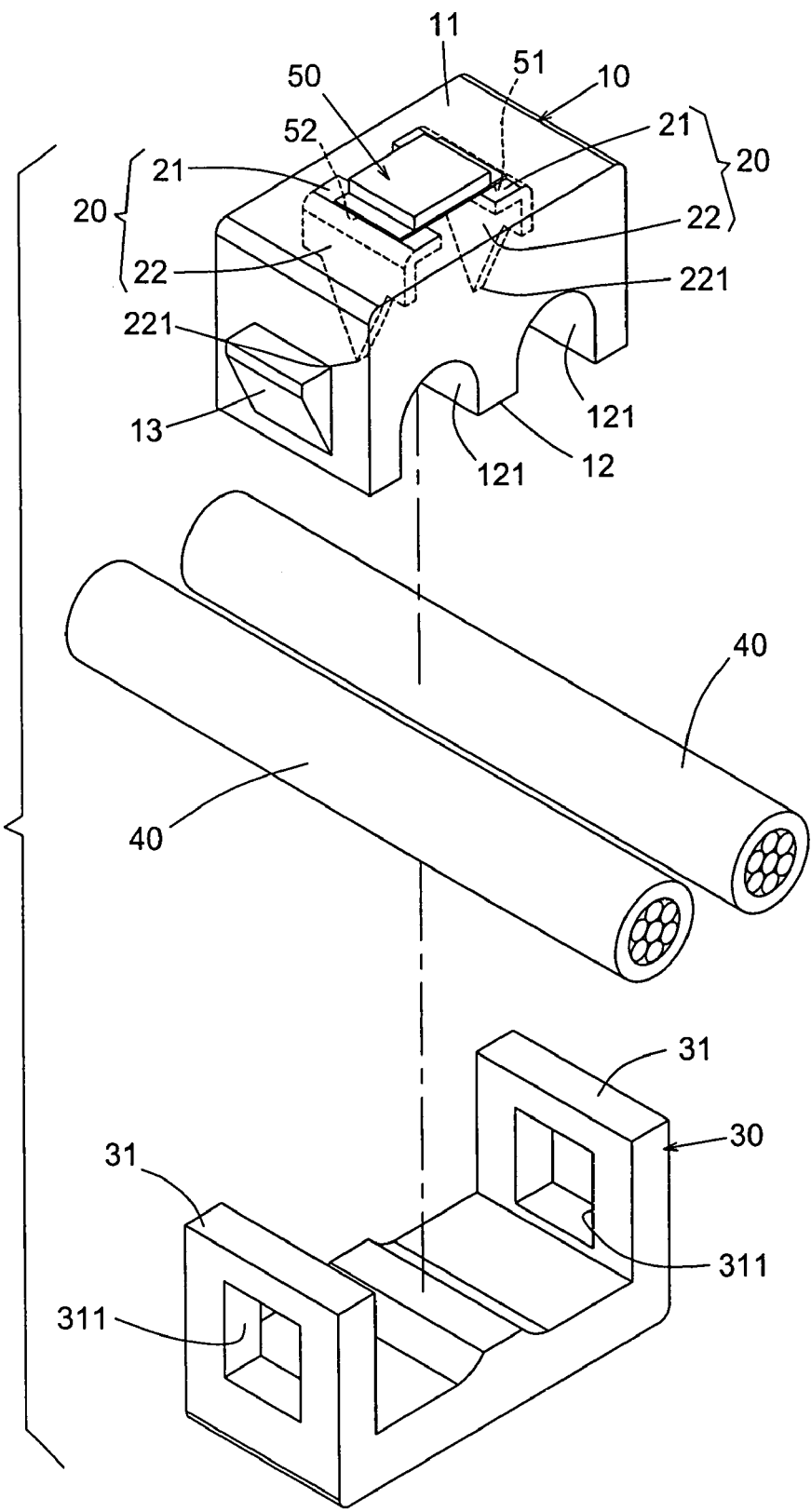
FIG. 2 is a perspective view according to FIG. 1, showing that two leads are to be clamped between the base seat and the connecting seat of the present invention.
Figure 3:
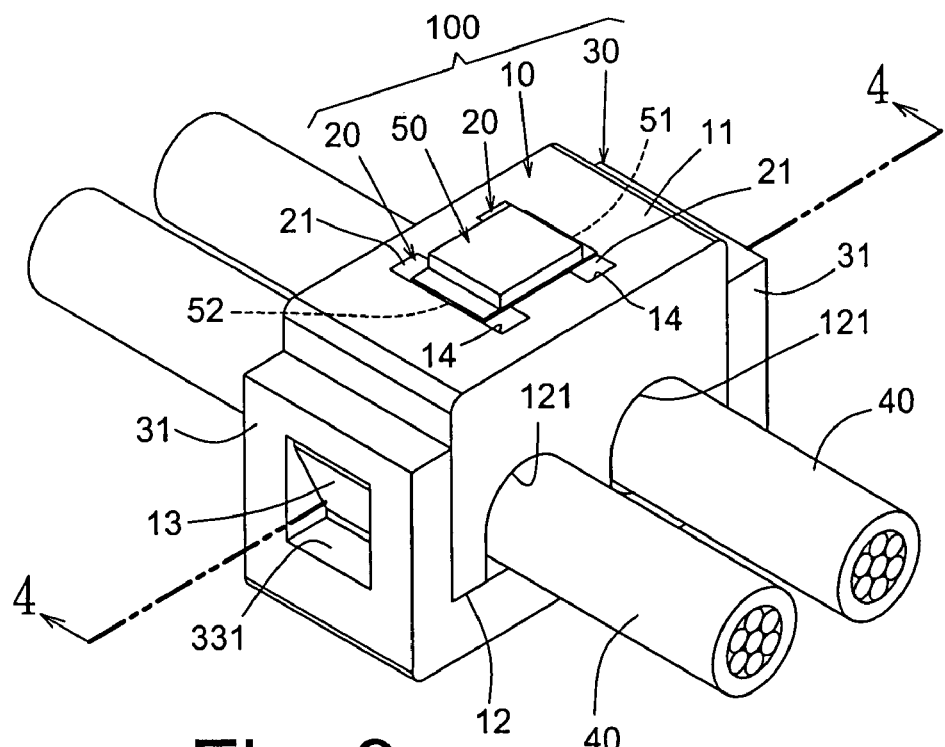
FIG. 3 is a perspective view according to FIG. 2, showing that the two leads are clamped between the base seat and the connecting seat of the present invention.
Figure 4:
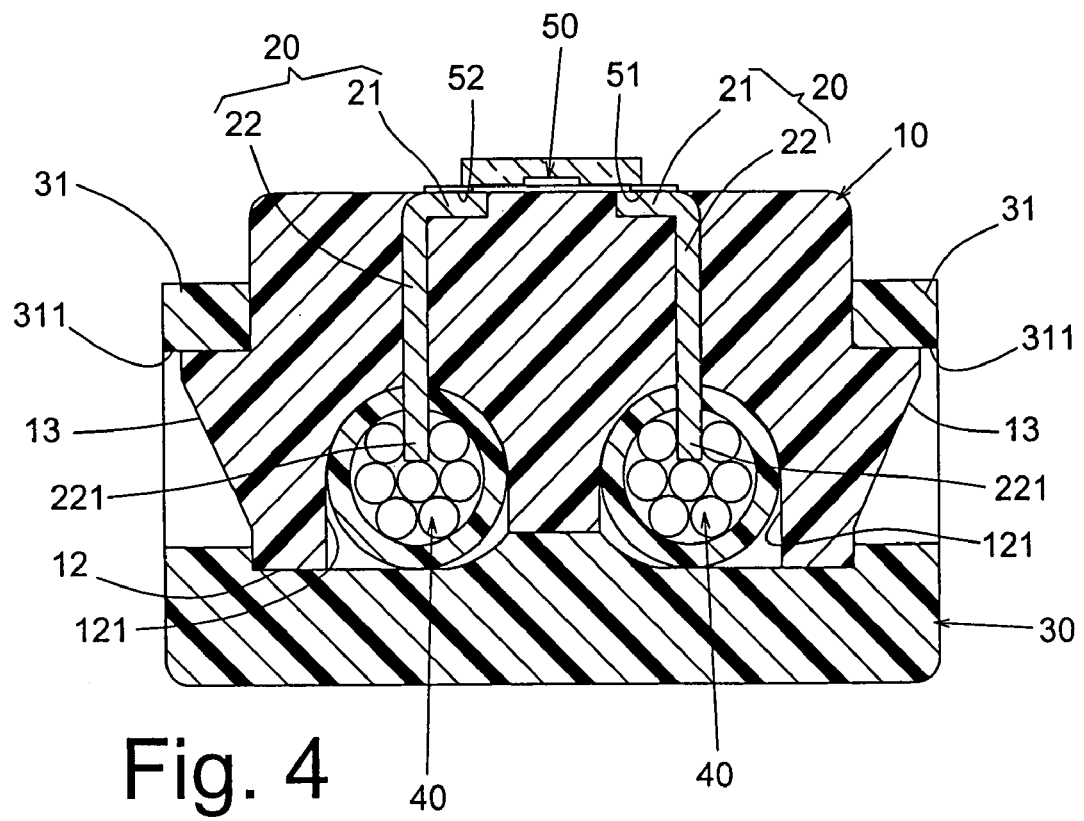
FIG. 4 is a sectional view taken along line 4-4 of FIG. 3.
Figure 5:
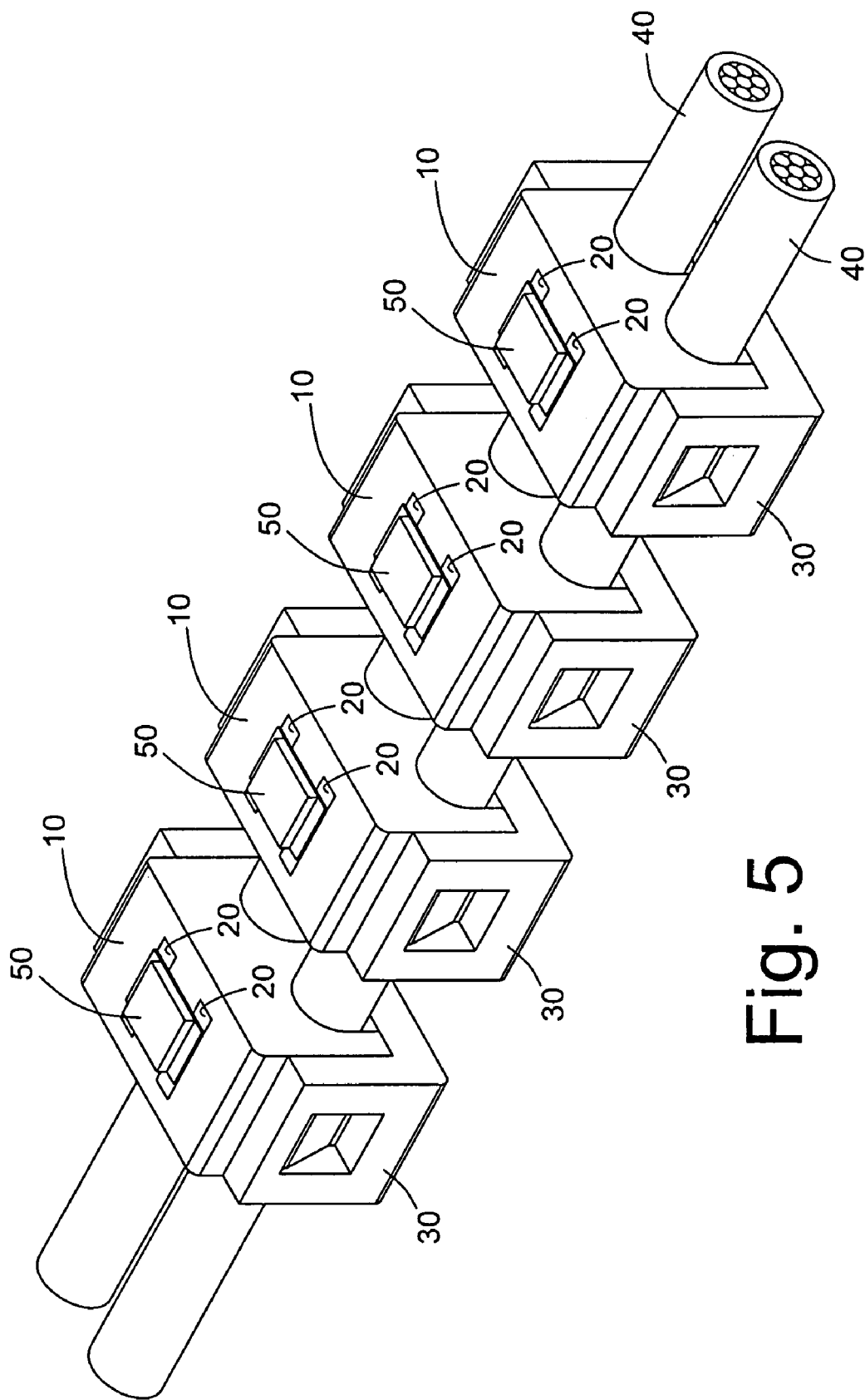
FIG. 5 is a perspective view showing that multiple light-emitting cell modules of the present invention are mounted on the leads.

Please refer to FIGS. 1 to 5. The light-emitting cell module 100 of the present invention includes: a base seat 10; multiple terminals 20 respectively inlaid in the base seat 10, a first end 21 of each terminal 20 being exposed to outer side of a first end 11 of the base seat 10, a second end 22 of each terminal 20 having a sharp thrust section 221 protruding from a second end 12 of the base seat 10; a connecting seat 30 latched with the second end 12 of the base seat 10, the connecting seat 30 and the second end 12 of the base seat 10 together tightly clamping and holding multiple leads 40 of positive electrode and negative electrode, the second ends 22 of the terminals 20 being aligned with the corresponding leads 40, whereby the thrust sections 221 thrust into the leads 40 to electrically connect the terminals 20 with the leads 40 of positive electrode or negative electrode; and a light-emitting cell 50 such as a light-emitting diode (LED). The two pins 51, 52 of the light-emitting cell 50 are soldered with the first ends 21 of the terminals 20 of the positive electrode and the negative electrode by way of, for example, surface mount technology (SMT). After powered on, the light-emitting cell 50 is lighted up.

Referring to FIGS. 1, 2, 3 and 4, in the light-emitting cell module 100 of the present invention, the second end 12 of the base seat 10 is recessed to form one or multiple lead channels 121 in which the leads 40 are accommodated. Two sides of the base seat 10 are formed with latch hooks 13, while two sides of the connecting seat 30 are formed with latch lugs 31 each having a latch hole 311. The latch hooks 13 of the base seat 10 are correspondingly latched in the latch holes 311 of the latch lugs 31 of the connecting seat 30 so as to firmly latch the base seat 10 with the connecting seat 30.

In the light-emitting cell module 100 of the present invention, the terminals 20 are made from a metal sheet. The terminals 20 are then placed in an injection mold for molding the base seat 10. After the base seat 10 is injection molded, the terminals 20 are integrated with the base seat 10. Alternatively, the terminals 20 are inserted in the insertion cavities 14 of the base seat 10.

Figure 6:
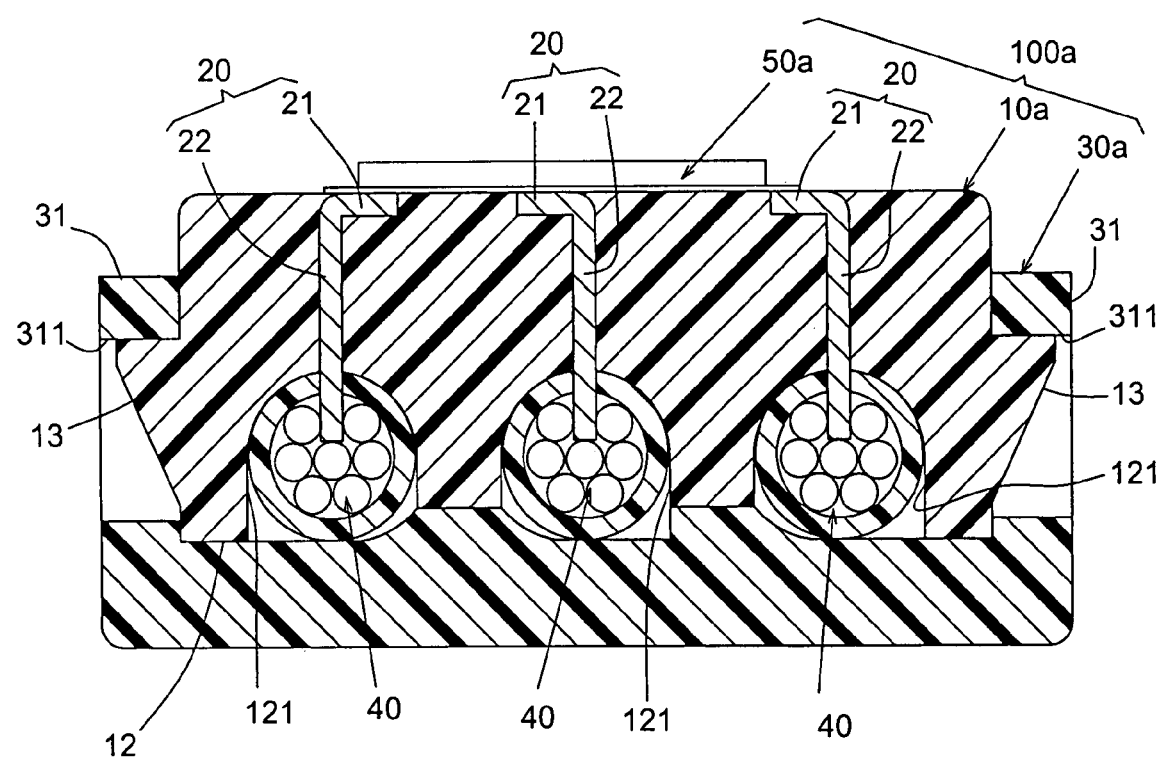
FIG. 6 is a sectional view of a second embodiment of the present invention.
Figure 7:
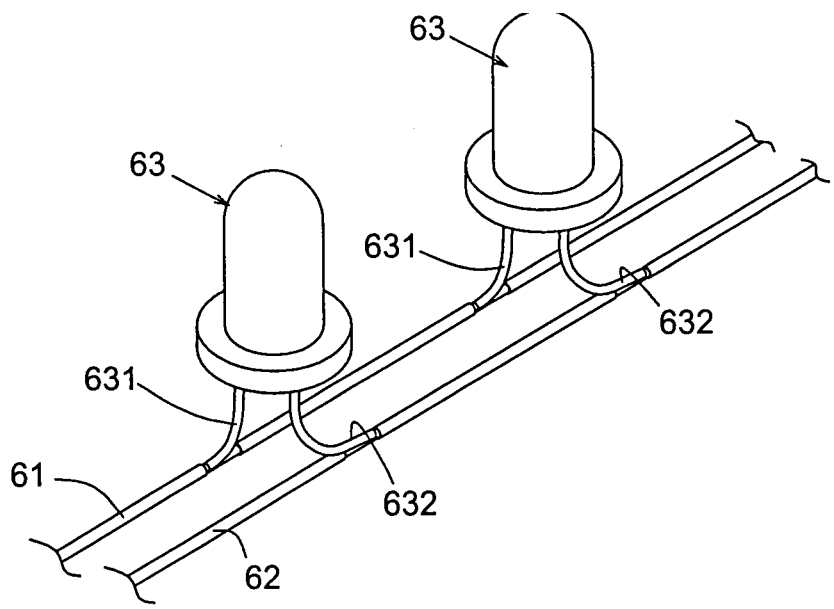
FIG. 7 is a perspective view of a conventional decoration light.
Figure 8:
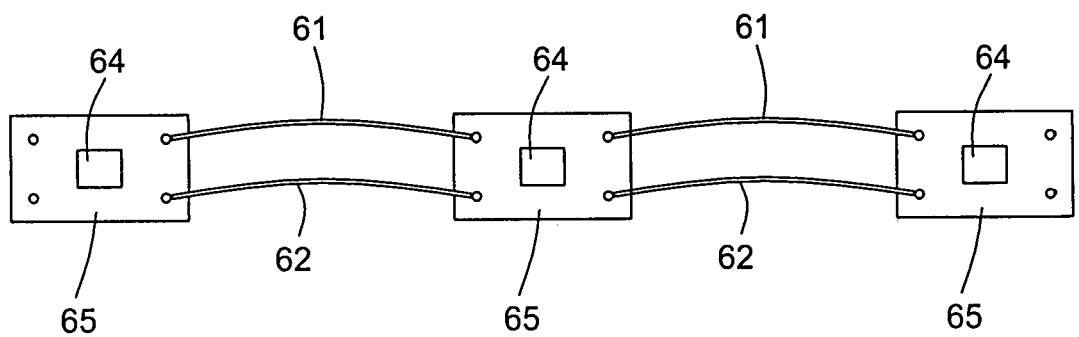
FIG. 8 shows another type of conventional decoration light.

FIG. 6 shows another embodiment of the light-emitting cell module 100a of the present invention, in which at least three terminals 20 are side by side inlaid in the base seat 10a. The second end 12 of the base seat 10a is recessed to form at least three lead channels 121. At least three leads 40 are tightly clamped and held between the base seat 10a and the corresponding connecting seat 30a. The second ends 22 of the terminals 20 respectively thrust into the leads 40. Accordingly, a light-emitting cell 50a with three contacts can be mounted on the first ends of the three terminals. After powered on, the light-emitting cell 50a is lighted up.

Referring to FIGS. 1, 2, 3 and 5, in the light-emitting cell module 100 of the present invention, the light-emitting cell 50 is previously soldered between two terminals 20 of the base seat 10. Therefore, as necessary, the base seat 10 and the connecting seat 30 can be latched with each other to tightly clamp the leads 40 of different polarities in a suitable position. At this time, the terminals 20 inlaid in the base seat 10 respectively thrust into the corresponding leads 40 to electrically connect therewith. After powered on, the light-emitting cells 50 bridged between the terminals 20 are lighted up as a Christmas light, decoration light, etc. Accordingly, the light-emitting cell module 100 can clamp the leads 40 in any position as necessary. In addition, the light-emitting cell 50 is independently mounted on the base seat 10 and can be independently manufactured. In manufacturing, the light-emitting cell 50 is not directly soldered with the leads 40 so that the light-emitting cell 50 will not detach from the leads 40 due to tangling and pulling. Therefore, the quality of the product can be ensured.

The above embodiments are only used to illustrate the present invention, not intended to limit the scope thereof. Many modifications of the above embodiments can be made without departing from the spirit of the present invention.

What is claimed is:

1. A light-emitting cell module comprising:
    (a) a base seat;
    (b) multiple terminals respectively inlaid in the base seat, a first end of each terminal being exposed to outer side of a first end of the base seat, a second end of each terminal having a sharp thrust section protruding from a second end of the base seats, the terminals being made from a metal sheet and thereafter being placed in an injection mold for molding the base seat, whereby after the base seat is injected molded, the terminals are integrated with the base seat;
    (c) a connecting seat latched with the second end of the base seat, the connecting seat and the second end of the base seat together tightly clamping and holding multiple leads of positive electrode and negative electrode, the second ends of the terminals being aligned with the corresponding leads, whereby the thrust sections of the second ends thrust into the leads to electrically connect the terminals with the leads; and
    (d) a light-emitting cell having two pins which are soldered with the first ends of the terminals of the positive electrode and the negative electrode.

2. A light-emitting cell module comprising:
    (a) a base seat, the base seat being formed with insertion cavities;
    (b) multiple terminals being respectively inserted in the insertion cavities of the base seat to thereby be respectively inlaid in the base seat, a first end of each terminal being exposed to outer side of a first end of the base seat, a second end of each terminal having a sharp thrust section protruding from a second end of the base seat;
    (c) a connecting seat latched with the second end of the base seat, the connecting seat and the second end of the base seat together tightly clamping and holding multiple leads of positive electrode and negative electrode, the second ends of the terminals being aligned with the corresponding leads, whereby the thrust sections of the second ends thrust into the leads to electrically connect the terminals with the leads; and
    a light-emitting cell having two pins which are soldered with the first ends of the terminals of the positive electrode and the negative electrode.

* * * * *